United States Patent
Ueda et al.

(10) Patent No.: US 6,719,876 B1
(45) Date of Patent: Apr. 13, 2004

(54) INTERNAL ELECTRODE TYPE PLASMA PROCESSING APPARATUS AND PLASMA PROCESSING METHOD

(75) Inventors: Masashi Ueda, Fuchu (JP); Tomoko Takagi, Tama (JP)

(73) Assignee: Ishikawajima-Harima Heavy Industries Co., Ltd., Tokyo (JP)

( * ) Notice: Subject to any disclaimer, the term of this patent is extended or adjusted under 35 U.S.C. 154(b) by 149 days.

(21) Appl. No.: 09/830,879

(22) PCT Filed: Sep. 11, 2000

(86) PCT No.: PCT/JP00/06189

§ 371 (c)(1),
(2), (4) Date: May 2, 2001

(87) PCT Pub. No.: WO01/19144

PCT Pub. Date: Mar. 15, 2001

(30) Foreign Application Priority Data

Sep. 9, 1999  (JP) .......................... 11/255219
Mar. 2, 2000  (JP) ........................... 2000/056584

(51) Int. Cl.[7] .......................... H05H 1/00; C23C 16/00; H01J 21/00
(52) U.S. Cl. .............. 156/345.48; 118/723 I; 118/723 AN; 315/111.51
(58) Field of Search .............. 118/723 I, 723 AN, 118/723 E; 156/345.48, 345.47; 315/111.51

(56) References Cited

U.S. PATENT DOCUMENTS

| | | | | |
|---|---|---|---|---|
| 5,558,718 A | * | 9/1996 | Leung | 118/723 E |
| 5,795,452 A | * | 8/1998 | Kinoshita et al. | 204/298.37 |

FOREIGN PATENT DOCUMENTS

| | | | |
|---|---|---|---|
| JP | 04-021781 | 1/1992 | |
| JP | 04-230999 | 8/1992 | |
| JP | 04-236781 | 8/1992 | |
| JP | 08-299785 | 11/1996 | |
| JP | 09-293600 | 11/1997 | |
| JP | 2785442 B2 | 5/1998 | |
| JP | 11-354460 | 12/1999 | |
| JP | 2000-058465 | 2/2000 | |
| JP | 2000-235953 | 8/2000 | |
| JP | 2002-217119 A | * 8/2002 | ......... H01L/21/205 |

* cited by examiner

Primary Examiner—Parviz Hassanzadeh
(74) Attorney, Agent, or Firm—Oliff & Berridge, PLC

(57) ABSTRACT

A plasma processing apparatus is of an internal electrode type, and an inductive coupling type electrode arranged facing a substrate has a shape formed by bending back a conductor at its central portion. A high frequency power is supplied to an end of the electrode so that a standing wave of half wavelength are produced at straight portions formed by bending back the electrode to make an antinode there and thus a plasma discharge is generated around the electrode. The controlled standing waves with its antinodes positively generated at the straight portions of the electrode are effectively used.

6 Claims, 8 Drawing Sheets

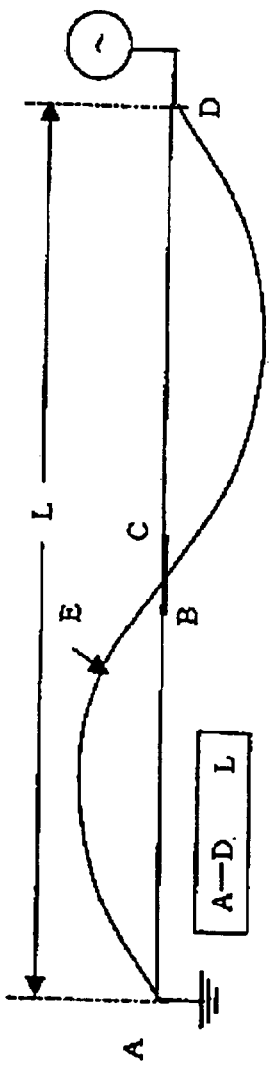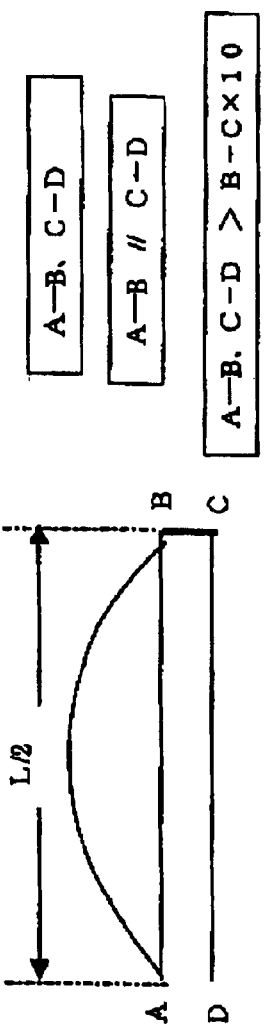

INTERNAL ELECTRODE TYPE PLASMA PROCESSING APPARATUS AND PLASMA PROCESSING METHOD

TECHNICAL FIELD

The present invention relates to an internal electrode type plasma processing apparatus and plasma processing method, more particularly, relates to a plasma processing apparatus and plasma processing method provided with an inductive coupling type electrode suited for deposition of an amorphous silicon thin film used for solar cells or thin film transistors and the like on a large-area substrate.

BACKGROUND ART

The electrodes of internal electrode type plasma CVD apparatuses have conventionally been of the parallel-plate type or the inductive coupling type.

If using the parallel-plate type electrode, when trying to raise frequency of a high frequency power in order to increase a film deposition rate and improve film characteristics, the problem arises that the electric discharge becomes non-uniform. This is caused by the occurrence of a standing wave on the electrode plate resulting on non-uniform distribution of plasma density and by the production of plasma at undesirable locations due to the voltage created by the feedback current to the ground. Further, as the substrate holder is made to function as a ground electrode, the backing plate for the substrate becomes required and there is the difficulty of maintaining the clearance between the backing plate and substrate uniform when the size of the electrode plate is increased so as to form a film on a large-area substrate. Also, handling of the backing plate becomes difficult generally. Therefore, a parallel-plate type electrode is not well suited to the deposition of a film on a large-area substrate.

As opposed to the above parallel-plate type electrode, an inductive coupling type electrode is free from the above problems. Accordingly, the inductive coupling type electrode is well suited to the deposition of a film on a large-area substrate when used in an internal electrode type plasma CVD apparatus, for example.

As an internal electrode type plasma CVD apparatus using an inductive coupling type electrode, for depositing an amorphous silicon thin film on a large-area substrate to form a solar cell etc, there is the apparatus disclosed in Japanese Unexamined Patent Publication (Kokai) No. 4-236781, for example. In this plasma CVD apparatus, the electrode for discharge is formed by a flat coil having a ladder-like structure which is arranged parallel to the substrate. The ladder-like flat coil is formed by a conductive wire. The source gas is introduced from a reaction gas introduction pipe provided at a single location of the reactor, while the inside of the reactor is evacuated through an evacuation pipe provided at a single location of the reactor. This flat coil increases the intensity of the electromagnetic field and improves the uniformity of the field. Further, as a similar conventional plasma CVD apparatus, there may be the apparatus disclosed in Japanese Patent No. 2785442. In this plasma CVD apparatus, as the electrode arranged facing the substrate, a flat coil electrode formed by a single conductive wire bent multiple times to form a zigzag configuration is used. A high frequency power is supplied from a high frequency generator to the two ends of this electrode.

Concerning the above inductive coupling type electrode, the ladder-shaped flat coil electrode according to Japanese Unexamined Patent Publication (Kokai) No. 4-236781 does not have a uniform current flowing at each rung of the ladder configuration and therefore does not give a uniform distribution of the electromagnetic field, so has the problem of the inability to deposit a uniform film on the large-area substrate.

The ladder-shaped flat coil electrode is a distributed constant circuit in view of an electric circuit. A current flowing at each section in the distributed constant circuit can not be calculated simply from resistance and path length of the circuit. In the ladder type electrode, an impedance of each ladder rung relative to other ladder rungs and a geometrical relation between each ladder rung and a feeding point is related to the magnitude of Poynting vector at each ladder rung. Experimentally, the phenomenon that most of the current flows at the ladder rung near the feeding point is observed.

Further, since the zigzag flat coil electrode according to Japanese Patent No. 2785442 is produced by bending a single long conductive wire and the high frequency power is supplied from one end, the power cannot be fed efficiently. Further, while effort is made in the design to prevent the generation of a standing wave as much as possible, it is impossible to prevent the generation of a standing wave at undesirable locations due to the configuration of the electrode. Therefore, the film deposition is disturbed. That is, an unintentional standing wave is produced at the electrode, and this standing wave disturbs the distribution of plasma and results in poor uniformity of film deposition.

Then, in the plasma CVD apparatus and the like of the internal electrode type and inductive coupling type, it is desired to generate the plasma around the electrode by positively producing and utilizing the standing wave along the electrode arranged in the processing chamber. The plasma generated around the electrode receives energy for plasma generation from the antinode portion of the standing wave. Accordingly, it is preferred to control the standing wave generated along the electrode and the number or the positions of the antinodes to be formed in a desirable situation. Thereby, the standing wave can be actively used in a controllable state so that the antinodes are produced at desirable positions along the electrode, and therefore it is possible to skillfully control a distribution of plasma and to deposit a film on a large-area substrate with a good situation.

Further, as a general discussion, when proposing an electrode configuration in the internal electrode type plasma processing apparatus, concerning the standing wave positively produced on the electrode, the relationship between the frequency of the high frequency power supplied to the electrode and plasma produced around the electrode in the reactor due to the high frequency power sometimes cannot be ignored. Further, the plasma exited around the electrode due to the standing wave formed on the electrode, specifically the plasma parameters, have a major effect on the standing wave and sometimes make it necessary to reevaluate the design parameters of the electrode configuration. In this case, it is required that sufficient consideration be given to the plasma parameters when designing the electrode.

The objective of the present invention is to solve the above problems, positively utilize a standing wave in a controllable state to achieve a good uniformity of the plasma density, realize a configuration of the electrode considering the plasma parameters around the electrode, and to provide an internal electrode type plasma processing apparatus and plasma processing method which is suitable for deposition of a film on a large-area substrate for a solar cell etc.

DISCLOSURE OF INVENTION

The internal electrode type plasma processing apparatus and method according to the present invention are configured so as to achieve the above objects.

The plasma processing apparatus of the present invention is the apparatus of the internal electrode type provided with an inductive coupling type electrode arranged in a vacuum processing chamber. The above electrode is formed so that the total length thereof is substantially equal to an excitation wavelength, and one end of the electrode is grounded and another end is connected to a high frequency power source. A standing wave of one wavelength is produced along the electrode when the high frequency power source supplies a high frequency power to the electrode. When producing the standing wave on the electrode, a node of the standing wave along the electrode is formed at a central portion of the electrode, and antinodes of the standing wave are formed at half portions of said electrode, which exists at both sides of a center point.

Each part of the standing wave, which are produced on the halves of the electrode, are mutually intensified to supply the electromagnetic energy to the surrounding space of the electrode, and the plasma of uniform density is generated in the surrounding space of the electrode. When generating the plasma within the processing chamber, active use of the standing wave positively generated on the electrode is performed.

In the above plasma processing apparatus, the electrode is formed to be U-shaped by bending it back at the central portion, and each of the half portions of the electrode corresponds to a straight portion, and both half portions are arranged in parallel.

In the above plasma processing apparatus, the length of the half portion of the electrode is substantially equal to a half of the wavelength of the supplied high frequency power.

In the above plasma processing apparatus, a plurality of the electrodes are arranged to make a stratified structure comprising a plurality of layers within the vacuum processing chamber, a plurality of film depositing regions are produced using the space between the electrodes included in the plurality of layers, and film deposition on a substrate is performed in each of the plurality of film depositing regions. This structure can increase a processing efficiency of substrates.

The plasma processing apparatus of the present invention is the apparatus of an internal electrode type, which is provided with an inductive coupling type electrode in a vacuum processing chamber, and the electrode is formed so that a total length of the electrode is determined to natural number times of a half of an excitation wavelength, one end of the electrode is grounded and another end thereof is connected to a high frequency power source, and standing waves are produced along the electrode when the high frequency power source supplies a high frequency power to the electrode, and further a node of the standing waves produced along the electrode is formed at a central portion of the electrode, and at least one antinode of the standing waves is formed at half portions of the electrode, which exist at both sides of a center point.

In the above plasma processing apparatus, the electrode is formed to be U-shaped by bending it back at the central portion, and each of the half portions of the electrode is a straight portion, both of the half portions are arranged in parallel, and the node of the standing wave is consistent with a bending back point.

In the above plasma processing apparatus, a plurality of electrodes are arranged to make a stratified structure comprising a plurality of layers within the vacuum processing chamber, a plurality of film depositing regions are produced using the space between the electrodes included in the plurality of layers, and film deposition on a substrate is performed in each of the plurality of film depositing regions.

The plasma processing apparatus of the present invention comprises a plurality of electrodes of an inductive coupling type in a vacuum processing chamber, and each of the plurality of electrodes is formed by bending back a conductor at its central portion to be U-shaped, the straight portions formed by the bending back are made parallel and are arranged to be in one plane, and further one end of each of the electrodes is grounded and another end thereof is connected to a high frequency power source. Further, the plurality of electrodes positioned parallel to each other are placed so that a straight portion of a power supplying side is adjacent to a straight portion of a grounded side, and high frequency powers respectively supplied into the ends of the straight portions of power supplying side for the plurality of electrodes are in phase.

In the above plasma processing apparatus, the length of each straight portion formed by bending back the plurality of electrodes is determined to produce an antinode of a standing wave on the straight portion.

In the above plasma processing apparatus, plural electrodes arranged to be in one plane is configured as an electrode array, a plurality of the electrode arrays are placed as a stratified structure within the vacuum processing chamber, a plurality of film depositing regions are produced using a space between said electrode arrays of plural layers, and film deposition on a substrate is performed in each of the plurality of film depositing regions.

The plasma processing apparatus of the present invention comprises an electrode of an inductive coupling type in a vacuum processing chamber and the electrode is formed by bending back a conductor at its central portion to be U-shaped. Further, a plasma discharge is produced around the electrode by supplying a high frequency power to an end of the electrode so that a standing wave of half wavelength is produced at a straight portion formed by bending back the electrode. In this case, frequency (f) of the high frequency power at this time is determined by $f=(c/\sqrt{\epsilon_p})/2L1$, where c is the speed of light, L1 is the length of the straight portion formed by bending back the electrode, and $\epsilon_p$ is the relative dielectric constant of plasma produced around the electrode.

In the above plasma processing apparatus, the frequency of the high frequency power is changed according to plasma parameters around the electrode.

In the above plasma processing apparatus, a plasma CVD processing is performed for depositing a film with a solar cell function on a large area substrate within the vacuum processing chamber.

In the above plasma processing apparatus, the length L1 of the electrode is preferred to be more than 0.8 meter.

The plasma processing method of the present invention is the processing method executed in the plasma processing apparatus having an electrode of an inductive coupling type placed within a vacuum processing chamber, and the plasma processing method is characterized in that the electrode is formed by bending back a conductor at its central portion, a total length of the electrode is determined to be a natural number times of a half of an excitation wavelength, a high frequency power is supplied to end of the electrode, a node of a standing wave produced in the electrode is consistent with a bending back point, and the standing wave makes density distribution of plasma around the electrode to be uniform.

The plasma processing method of the present invention is the method executed in a plasma processing apparatus comprising an electrode of an inductive coupling type in a vacuum processing chamber, and the electrode is formed by bending back a conductor at its central portion to be U-shaped, and a plasma discharge is produced around the electrode by supplying a high frequency power to an end of the electrode so that a standing wave of half wavelength is produced at a straight portion formed by bending back the electrode.

In the above plasma processing method, frequency (f) of the high frequency power at this time is determined by $f = (c/\sqrt{\in_p})/2L1$, where c is the speed of light, L1 is the length of the straight portion formed by bending back the electrode, and $\in_p$ is the relative dielectric constant of plasma produced around the electrode.

In the above plasma processing method, the frequency of the high frequency power is changed according to plasma parameters around the electrode.

BRIEF DESCRIPTION OF THE DRAWINGS

FIG. 8 is a view of the electrode length in relation to a sinusoidal waveform.

FIG. 9 is a view of the electrode half-length in relation to the sinusoidal waveform.

BEST MODE FOR CARRYING OUT THE INVENTION

The preferred embodiments of the present invention will be described next with reference to the attached drawings.

Figure 1:
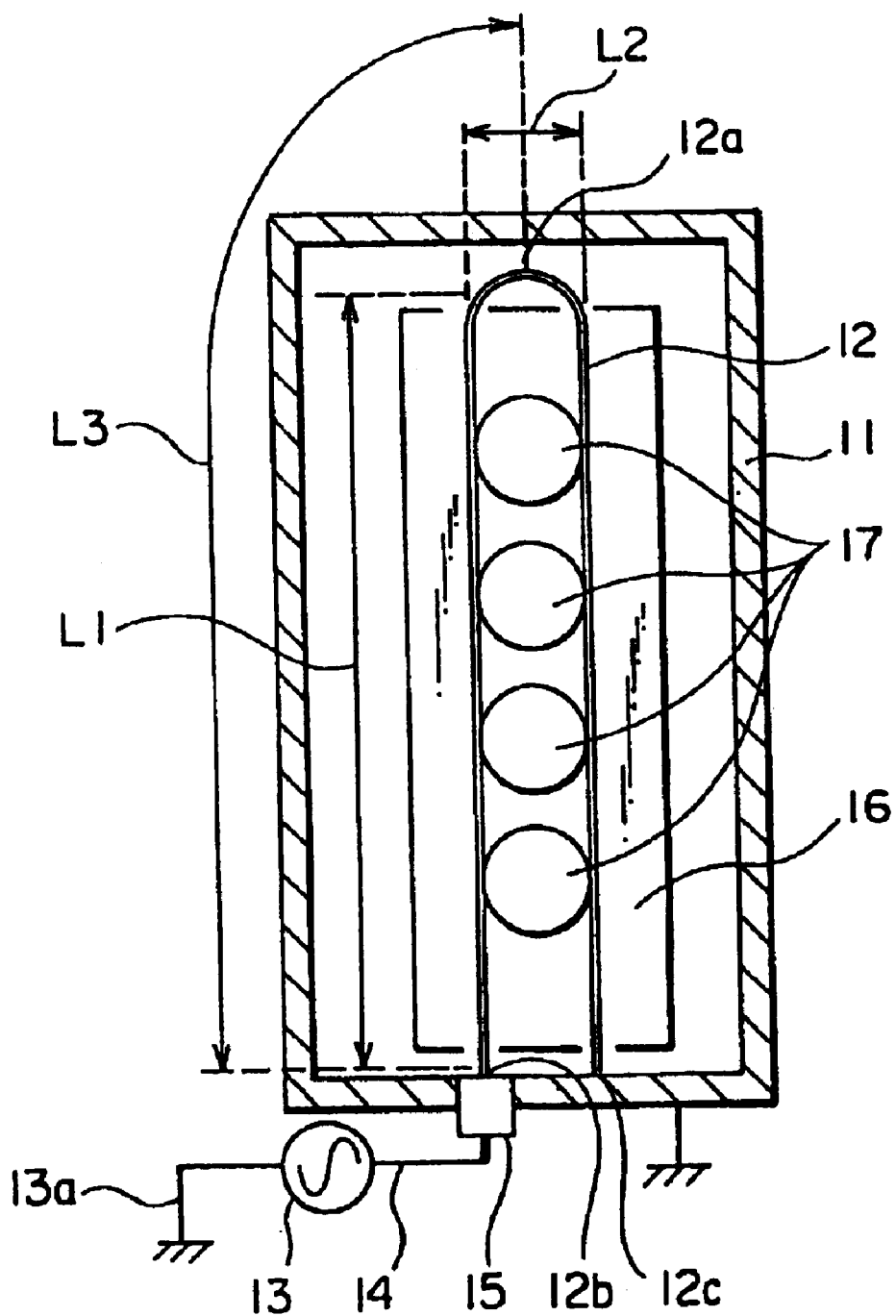
FIG. 1 is a front view of an electrode showing the internal structure of a plasma processing apparatus according to a basic embodiment of the present invention.
Figure 2:
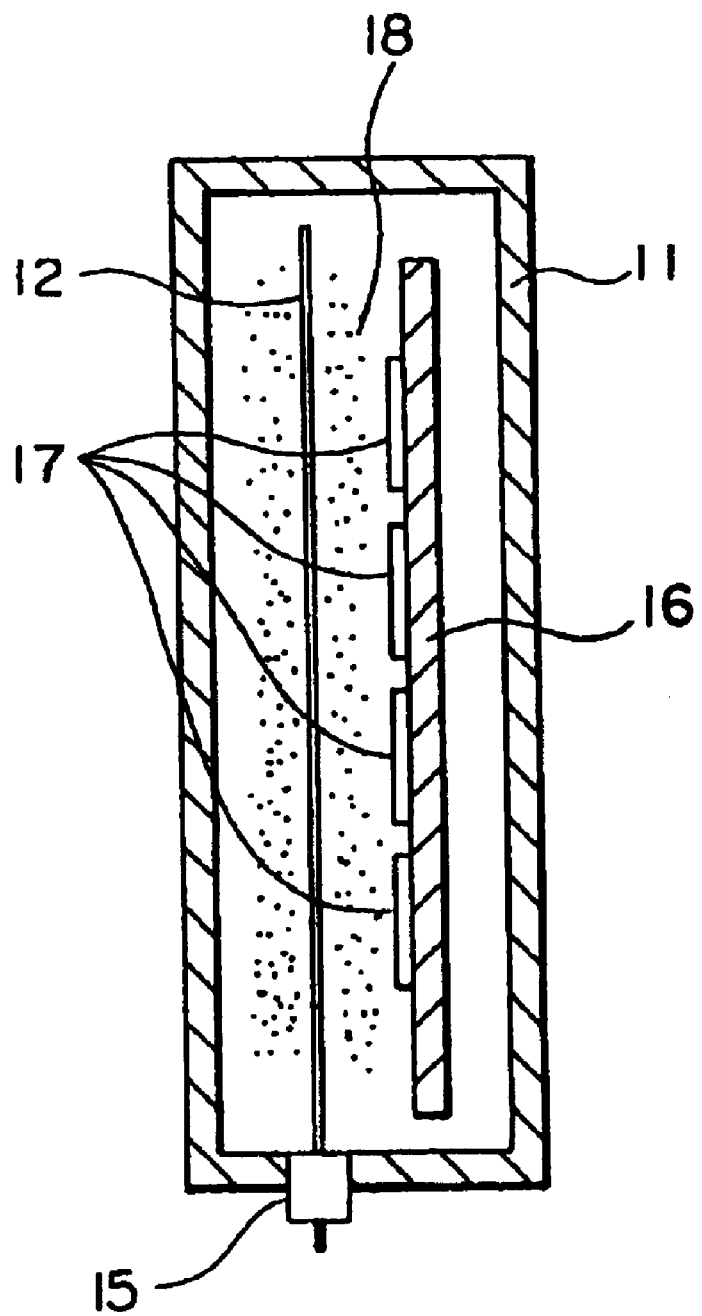
FIG. 2 is a side view of the inside of the basic embodiment.

The basic embodiment of the present invention will be explained first with reference to FIG. 1 and FIG. 2. The plasma processing apparatus according to this embodiment is, for example, an inductive coupling type plasma CVD apparatus for depositing a thin film having the function of a solar cell on a substrate.

The film-deposition chamber 11 is a reactor in which a film is deposited or grown on a substrate conveyed inside by plasma CVD and is able to be set to required vacuum conditions. The film-deposition chamber 11 has a single electrode 12 arranged in a vertical standing state, for example. The electrode 12 is supplied with high frequency power as explained later through its one end. This electrode 12 has the function of an antenna for supplying the high frequency electric power to the film-deposition chamber 11. The electrode 12 is preferably formed by a conductive wire (conductive line-shaped member), which has a requisite length and diameter with relation to the frequency of the supplied high frequency power, bent back at its central portion (bent back point) so as to be in one plane and thereby being given a substantially U-shape when seen from the front view. The electrode 12 has a bent back portion with a curved shape and two straight portions to be substantially parallel.

In this embodiment, for example, the electrode 12 is arranged to be vertical with the curved bent portion at the top and the open ends at the bottom. Note that it is also possible to arrange it with the curved bent portion at the bottom and the open ends at the top. The structure supporting the electrode is not illustrated, but any support structure can be employed.

By bending the conductive wire into two, a U-shaped electrode 12 is formed, and the half length is shown by L3 in the figure as the length between the center point 12a and the ends. The portion of the length L3 is the length of a straight portion formed by bending back the electrode 12 (hereinafter referred to as "the bent back straight portion") and is the portion in which the antinode of the standing wave is produced.

In the electrode 12, the high frequency power is supplied to the end 12b. A high frequency generator or power source 13 supplying the high frequency power is provided at the outside of the film-deposition chamber 11. The feeder 14 from the high frequency generator 13 is led through a connection part 15 provided at the film-deposition chamber 11 into the inside of the film-deposition chamber 11 and connected to the end 12b of the electrode 12. By this, the high frequency power is supplied w to the electrode 12. The connection part 15 has a built-in feed-through structure by which the feeder passes through the wall of the film-deposition chamber 11. The end 12b of the electrode 12 serves as the feeding point.

The other end 12c of the electrode 12 is electrically connected to the film-deposition chamber 11. The film-deposition chamber 11 is made of a conductive member (metal member) and is maintained at the ground potential by being grounded. Therefore, the other end 12c of the electrode 12 is grounded. The other line 13a of the high frequency generator 13 is grounded.

The two ends of the U-shaped electrode 12 are supplied by the high frequency generator 13 with a high frequency power of a frequency higher than the conventionally used high frequency power (for example, 13.56 MHz). The high frequency power used here is a high frequency power having the frequency of 60 MHz or more, for example. In the case of the present embodiment, however, the frequency of the high frequency power supplied to the electrode 12 is determined by a specific method, explained later, in consideration of the plasma parameters around the electrode 12.

A single backing plate 16 is, for example, arranged in a state parallel to the plane containing the electrode 12 at one side of the electrode 12. Also, for example, four disk-shaped substrates 17 are arranged on the surface of the backing plate 16 facing the electrode. The backing plate 16 has the function of a substrate holder with a built-in heater. Also, the four substrates 17 are arranged on the backing plate 16 along the longitudinal direction of the U-shaped electrode 12. As shown in FIG. 1, in this embodiment, the four substrates 17 are placed to exist corresponding to the position of the space between the two straight portions of the U-shaped electrode 12.

The plasma CVD apparatus according to the present embodiment uses the inductive coupling type electrode, so unlike a parallel plate type electrode, the above backing plate is not necessarily essential. Use of the backing plate is however preferable to improve the uniformity of the substrate temperature and to shield the heater panel from the electromagnetic field. Note that in the plasma CVD apparatus shown in FIG. 1 and FIG. 2, for convenience in explanation, the illustrations of the source gas feed mechanism, the vacuum evacuation mechanism (vacuum pump), the substrate holder, the detailed structure of the substrate heating mechanism, the substrate cooling mechanism, etc. are omitted.

The conductive wire used for the electrode 12 is for example rod-shaped and is made from a metal material such as stainless steel or aluminum. When the electrode 12 is rod-shaped, its diameter is for example at least 5 mm. In FIG. 1, the relationship between the length of the straight portions L1 formed by bending back the conductive wire into two and the width between the two bent back portions L2 is drawn with the length L2 shown exaggerated larger than it actually is for convenience in the explanation. As an actual preferable embodiment, L1 is for example 75 cm to 2.0 m and L2 is for example about 8 cm. Therefore, the degree of curvature of the upper bent portion of the actual electrode 12 is also not as large as illustrated. In FIG. 1, as the lengths of the bent back portions of the electrode, the length L1 of the straight portion and the length L3 including half of the bent portion are shown, but the bent portion is considerably smaller than the straight portions in length, so the length L1 and the length L3 may be considered to be substantially the same in practice.

The length L1, in practice, is determined in accordance with the size of the substrate on which the film is to be deposited and is set as the length necessary for generating a standing wave, so is determined by the relation with the frequency of the high frequency power supplied. For example, when the frequency is 120 MHz, L1 becomes 1.25 m.

In principle, the length L1 (or length L3) of the bent back straight portions in the electrode 12 is found by the relationship of $$L1 = c/2f = \lambda/2 \text{ (or } f = c/2L1) \quad (1)$$

where f is the frequency of the high frequency power supplied, c is the speed of light, and $\lambda$ is the wavelength. According to this relationship if the size (dimensions etc.) of the electrode is determined in relation to the substrate (glass etc.), the frequency of the high frequency power supplied to the electrode is determined. Conversely, if the frequency of the high frequency power is determined, the dimensions etc. of the electrode are determined.

According to the above relationship (1), L1 becomes substantially equal to half of the wavelength of the high frequency power, while the total length L0 (=2L1) of the electrode 12 becomes substantially $\lambda$.

If the frequency becomes smaller than 120 MHz, the length L1 becomes larger than 1.25 m and the electrode cannot be provided inside the film-deposition chamber 11 in some cases. In such a case, for example, it is possible to reduce the length L1 by adding a coaxial cable structure to the ends of the electrode in order to provide a delayed wave structure relating to the electromagnetic wave. L1 is preferably set to a range of 75 cm to 1.25 m by doing this as explained above. The lengths L1 and L2 may be freely changed in accordance with the objective.

According to the electrode 12 having the above shape, if a high frequency power is supplied from the high frequency generator 13, standing waves with half of the wavelength can be formed at the straight portions formed by bending back the electrode, that is, the two straight portions having the length L1. The standing wave formed on the electrode is controlled so as to produce the antinodes of the standing wave at the central part of each of the two straight portions and the node at the center point 12a which is the bent back point.

In other words, the shape and dimensions of the electrode 12 is designed and the frequency of the high frequency power supplied to the electrode 12 is determined so that the standing waves are positively created having, for example, one antinode at each of the two parallel straight portions of the electrode 12. Further, when supplying the high frequency power from the high frequency power generator 13 to the U-shaped electrode 12, one end 12b is made to be the feeding point and the other end 12c is connected to the ground. By doing this, the standing wave of one wavelength is generated on the electrode 12 with controlled standing waves generated at the two straight portions of the electrode 12. In the standing waves of the half wavelength generated at each of the two straight portions of the U-shaped electrode 12, their antinodes are consistent in their positions and they mutually intensifies at the region between the straight portions. As a result, plasma with a uniform density is generated in the region between the two straight portions of the electrode 12 and in the surrounding regions.

As explained above, by the film-deposition chamber 11 provided with the electrode 12, when the inside of the film-deposition chamber 11 is evacuated to a required vacuum state by the vacuum pump, filled with a source gas etc. and a high frequency power of for example 100 MHz is fed through the end 12b to the electrode 12, controlled standing waves are produced at the two straight portions and plasma 18 having a uniform density is generated in the space surrounding the U-shaped electrode 12. A film is deposited on the four disk-shaped substrates 17 provided on the backing plate 16 by the resultant plasma CVD action. The standing wave is formed at each of the halves of the electrode 12 from the center point 12a, that is, the above-mentioned two straight portions. The standing waves control the plasma 18 to achieve a good distribution of the plasma. In particular, as mentioned above, the electrode 12 is designed so that the standing waves with half wavelength produced at the two straight portions are strengthened, so there is no fall in the density of the plasma 18 produced in the space surrounding the electrode 12 and the plasma 18 is controlled in state to the preferable distribution of density.

Note that the number of the antinodes at each of the two bent back straight portions of the electrode 12 is not necessarily limited to one. For example, it is possible to produce the standing waves having plural antinodes by supplying the high frequency power with the frequency higher than 100 MHz to the electrode 12 with above-mentioned dimensions. In this case, the relationship between the total length of the electrode 12 and the wavelength of the supplied high frequency power used for the excitation, is maintained, so that the total length of the electrode is a natural number times of the half of the excitation wavelength, and a node is formed at the bent back point of the U-shaped electrode 12.

As the relationship between the total length of the electrode and the wavelength of the supplied high frequency, by selecting the wavelength to form a standing wave at the bent back straight portions of the electrode 12 as mentioned above, a strong electromagnetic field strength can be generated in the region surrounding the electrode functioning as the antenna. If a discharge frequency becomes different from the designed one, a traveling wave from the feeding point of the electrode and a reflecting wave returned from the grounding point cancel each other on the electrode, and consequently effective electromagnetic field can not be produced around the electrode. This matter can be experimentally observed as a phenomenon that the electric discharge does not happen without giving the specific relationship between the length of the electrode (the length of the antenna) and the wavelength of the excitation high frequency.

Especially, if the total length of the electrode is equal to one wavelength, the node is made at the feeding point, the bent back point or the grounding point, and the electromagnetic field having the strength not being zero is produced at the remaining portions. Therefore, by making use of the electromagnetic field not being zero, plasma is generated and uniform film deposition can be performed around the center of the straight portions of the electrode.

Further, in the above structure, the bent portion of the U-shaped electrode 12 does not have to be exactly a curved shape and it may be bent sharply or in an angled shape. Also, the two straight portions of the electrode 12 are unnecessary to be strictly parallel. The shape of the electrode may be of V-shaped, for example, instead of the U-shaped one.

Further, it is possible to make the electrode having a shape similar to the U-shaped one as a whole by arranging the two different straight conductors in parallel and coupling the ends of them with another coupling member. That is, it is possible to form the electrode 12 by making the U-shape with the combination of some conductors.

Also, in the above structure, although the electrode 12 is placed in the vertical standing state to be toward a vertical direction, it may be placed in a lateral state to be toward a horizontal direction. In this case, the backing plate and the substrate are also arranged in the lateral state of the horizontal direction.

According to the above embodiment, because an inductive coupling type electrode is used, there is the advantage that the plasma density can easily be raised compared with a capacitive coupling type electrode. Further, by making the electrode U-shaped and using one of the ends of the electrode as the feeding point, due to the interaction of the standing waves produced at the two bent back straight portions, the plasma is strengthened and the density of the plasma can be kept from becoming nonuniform.

Further, according to the above embodiment, it is possible to manufacture the electrode more inexpensively than a parallel plate type electrode and the electrode is suited to depositing a film on a large area substrate.

When using a high frequency power of 100 MHz for example, the wavelength λ of the high frequency power is 3 m. Therefore, the size of the electrode 12 becomes about 150 cm (length)×12 cm (width), while the area effective for depositing a film becomes 120 cm×10 cm or so. In FIG. 1 and the like, disk-shaped substrates were drawn as the objects on which the film is to be deposited, but the plasma CVD apparatus of the present embodiment is more suited to depositing a film on rectangular substrates. Further, it is also suited to form films on not only stationary objects, but also on large-area moving substrates. By the use of the above internal electrode type plasma CVD apparatus with high frequency power, the ion bombardment on the depositing film is reduced, good film characteristics can be obtained, and a large area, high quality film can be formed.

Next, the practical conditions of the basic method of designing the internal electrode explained above will be considered.

The following modifications may be considered in the electrode design (antenna design) in view of the practical conditions. If the high frequency power is given from the high frequency generator 13 to the electrode 12, an electric discharge occurs and plasma is produced around the electrode 12 when an discharge gas is introduced into the film-deposition chamber 11 and the requisite vacuum state and other conditions are met. If plasma is produced around the electrode 12, the value of the relative dielectric constant of the surrounding space as determined by the initial basic electrode design (relative dielectric constant $\in_r$ at free space) becomes different. As a result, while a standing wave of half the wavelength was supposed to be produced at the portion of half the length of the electrode in relation with the length of the electrode, this design no longer holds true. Therefore, when dimensional conditions of the electrode 12 are given, the occurrence of the discharge around the electrode 12 after supplying the high frequency power should be envisioned and the frequency of the high frequency power determined envisioning plasma parameters.

If the discharge occurs around the electrode 12 and plasma is generated, the relative dielectric constant of the space around the electrode 12 is no longer 1. Therefore, the frequency of the high frequency power supplied to the electrode 12 is determined in consideration of the discharge conditions around the electrode 12. That is, if the relative dielectric constant of the plasma around the electrode 12 is $\in_p$, the frequency f is determined by $(c/\sqrt{\in_p})/2L1$ ... (2). Note that the relative dielectric constant $\in_p$ is given by the formula: $\in_p = 1 - \omega_p^2/\omega(\omega - jv)$ ... (3). Here, $\omega_p$ is the plasma frequency determined by the electron density, $\omega_p$ is the discharge frequency, and v is the collision cross section determined by the discharge pressure. The $\in_p$ of the above formula (2) is the value of the real part of formula (2) and is not necessarily limited to 1 or more.

Because the dielectric constant of the plasma differs depending on the discharge conditions, the determination of the frequency is extremely difficult. Therefore, in practice, the optimal discharge frequency is determined by experiments. Additionally, FIGS. 8 and 9 show the electrode length L and half-length L/2 in relation to a sinusoidal waveform E. In FIG. 8, the waveform E and the electrode begins at ground potential, located at A to the beginning of the bent-back portion B of the electrode near the node. The waveform E continues to the end of the bent-back portion C to terminate at the power source located at D. Thus, the electrode extends from the ground to power source locations A to D to length L. In FIG. 9, the length from A to B and from C to D extends about a half-length L/2, such that the distance from A to B and from C to B is much greater than the distance from B to C.

Figure 3:
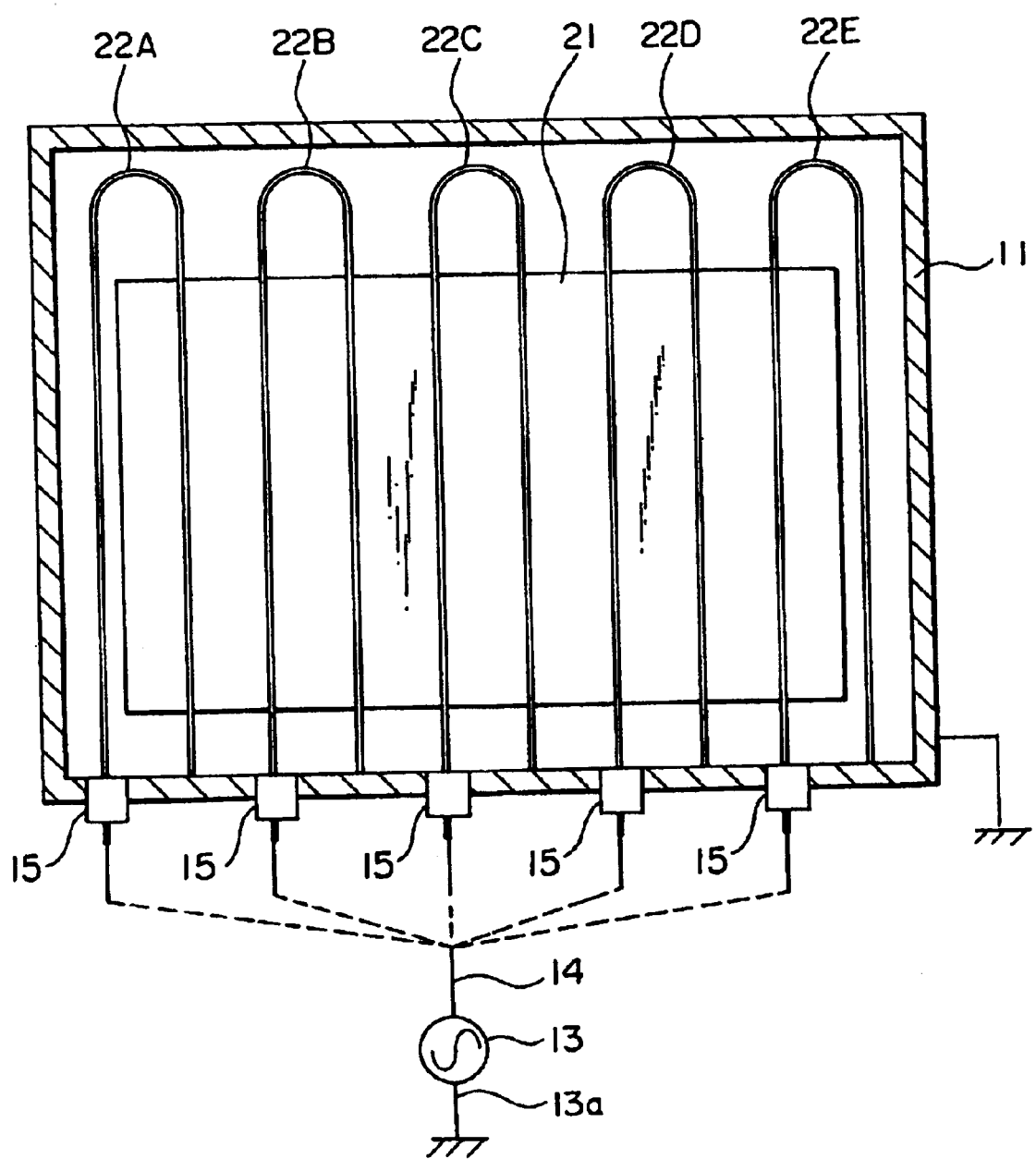
FIG. 3 is a front view of an electrode showing the internal structure of another embodiment of the present invention.

Another embodiment of the present invention will be explained next with reference to FIG. 3. FIG. 3 is a view similar to the above-mentioned FIG. 1. In FIG. 3, elements substantially the same as elements explained with reference to FIG. 1 are assigned the same reference numerals. In this embodiment, an inductive coupling type plasma CVD apparatus of the internal electrode type provided with electrodes having a configuration suitable for depositing a film on a larger sized rectangular substrate 21 is shown. The rectangular substrate 21 has a large area and is preferably a glass substrate on which a film of amorphous silicon is deposited for used as a solar cell. Plasma generating area is set over a broad area to face the film-deposition surface of this large area large-sized rectangular substrate 21, and therefore, the portion relating to the electrode is provided with five electrodes which are same as the above-mentioned U-shaped electrode 12. The five electrodes 22A, 22B, 22C, 22D and 22E are arranged to be included in a single plane parallel to the film-deposition surface of the rectangular substrate 21, which is vertical for example, and are provided in a line so that their straight portions are parallel with each other and preferably at equal intervals. In the electrode unit comprised by the electrodes 22A to 22E, the electrodes are arranged with their bent portions at the top and the ends at the bottom. Each of the electrodes 22A to 22E is secured to the bottom wall of the film-deposition chamber 11. One end of each of the electrodes is provided with a connection portion 15, while the other end is connected to the film-deposition chamber 11 so as to be grounded. Further, the film-deposition chamber 11 shown in FIG. 3 is formed to be larger than the film-deposition chamber shown in FIG. 1 along with the larger size of the rectangular substrate 21. Note that the film-deposition chamber 11 is grounded as explained before.

In the configuration shown in FIG. 3, the five electrodes 22A to 22E are separately attached to the film-deposition chamber 11, but the electrodes array is configured so that the standing waves are generated at the two parallel straight portions of each of the electrodes as mentioned above.

Each of the five electrodes 22A to 22E is supplied through its connection portion 15 with the high frequency power having a predetermined frequency from the single high frequency generator 13 provided at the outside of the film-deposition chamber 11 keeping the same phase relationship. The method of determination of the frequency of the high frequency power supplied is as explained in the previous embodiment, and the frequency is determined in consideration of the discharge conditions. The high frequency power supplied from the high frequency power generator 13 to each of the electrodes 22A to 22E is set so that the controlled standing waves are produced at the straight portions of each of the electrodes.

The standing waves produced at the straight portions of the electrodes 22A to 22E are, as explained above, is controlled so that the plasma density of the space around the electrodes become uniform.

The above technical contents will be explained concretely. In FIG. 3, the electrode 22C is paid attention. In the electrode array, the power-supplied side of the straight portion of the electrode 22C is adjacent to the grounded side of the straight portion of the electrode 22B at the left side, and the grounded side of the straight portion of the electrode 22C is adjacent to the power-supplied side of the straight portion of the electrode 22D at right side. Watching only the electrode 22C, the vectors' direction of the electromagnetic field is reversed in a phase aspect between the power-supplied and the grounded straight portions in the electrode 22C. The electromagnetic field in the region between the power-supplied and the grounded straight portions in the electrode 22C is made stronger in its density by mutual action, As to the outsides of the power-supplied and the grounded straight portions of the electrode 22C, based on the relationship of the adjacent electrodes 22B and 22D and the supply of the high frequency power to the electrodes 22B and 22D, whose phase is identical to that of the high frequency power supplied to the electrode 22C, the same relationship of strengthening the electromagnetic field is also made in the respective regions between the power-supplied side straight portion of the electrode 22C and the grounded side straight portion of the electrode 22B, and between the grounded side straight portion of the electrode 22C and the power-supplied side straight portion of the electrode 22D. Thereby, the plasma of uniform density is generated in each of those regions. The above-mentioned characteristics are realized in the every one of electrodes 22A to 22E.

Therefore, in the space in front of the film-deposition surface of the rectangular substrate 21, no unevenness of intensity of the electromagnetic field is produced, plasma is generated with a uniform distribution of density, and a film of a uniform thickness is deposited on the large-area rectangular substrate 21. By controlling the standing waves generated at the electrodes to the desired states as mentioned above, the uniformity of film thickness can be improved.

In the above embodiment, the number of electrodes may be freely set in accordance with the size of the substrate on which the film is being deposited. Further, while use of a single high frequency generator is preferable, plural generators may also be used.

Figure 4:
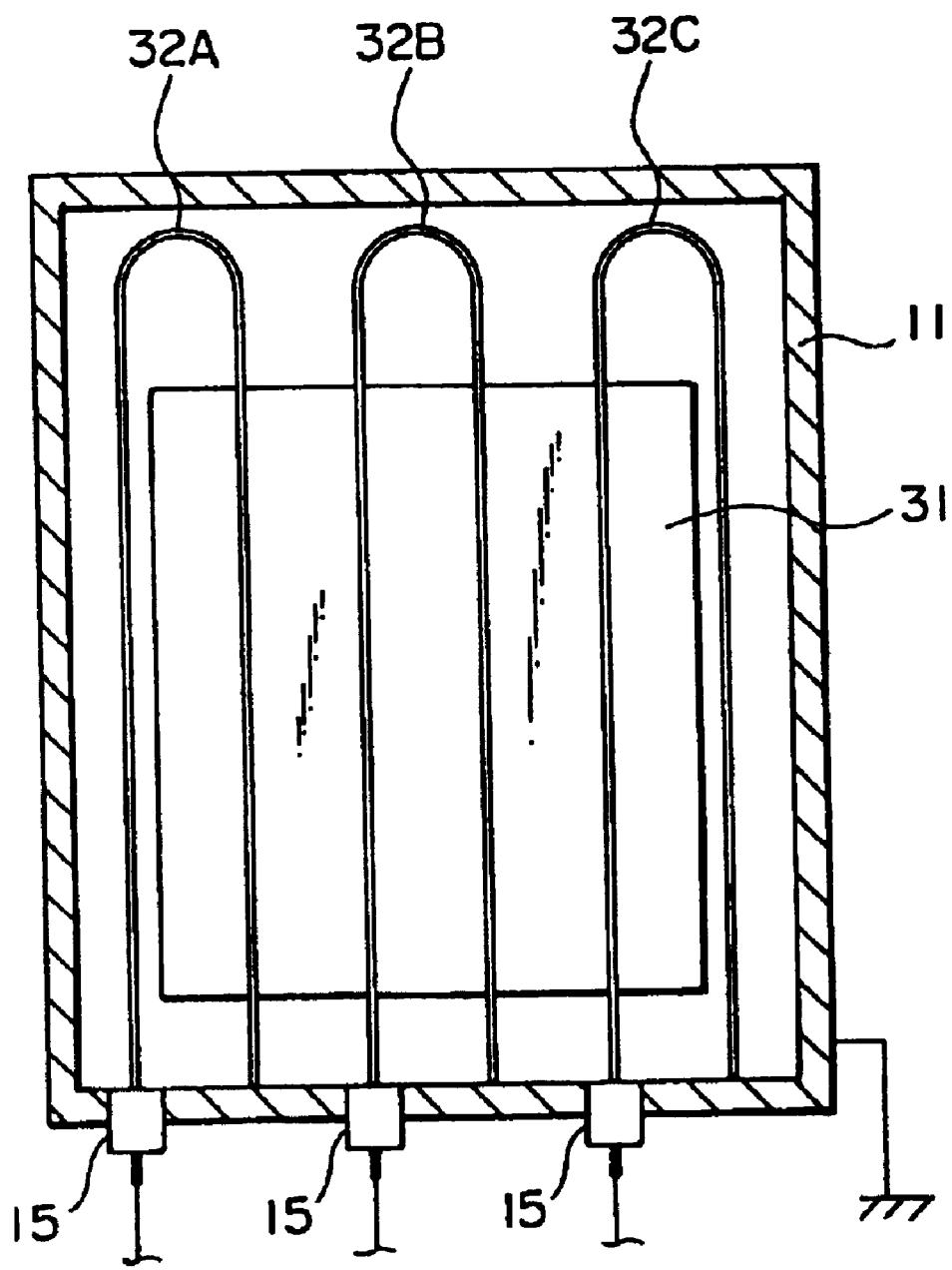
FIG. 4 is a front view of an electrode showing the internal structure of another embodiment of the present invention.
Figure 5:
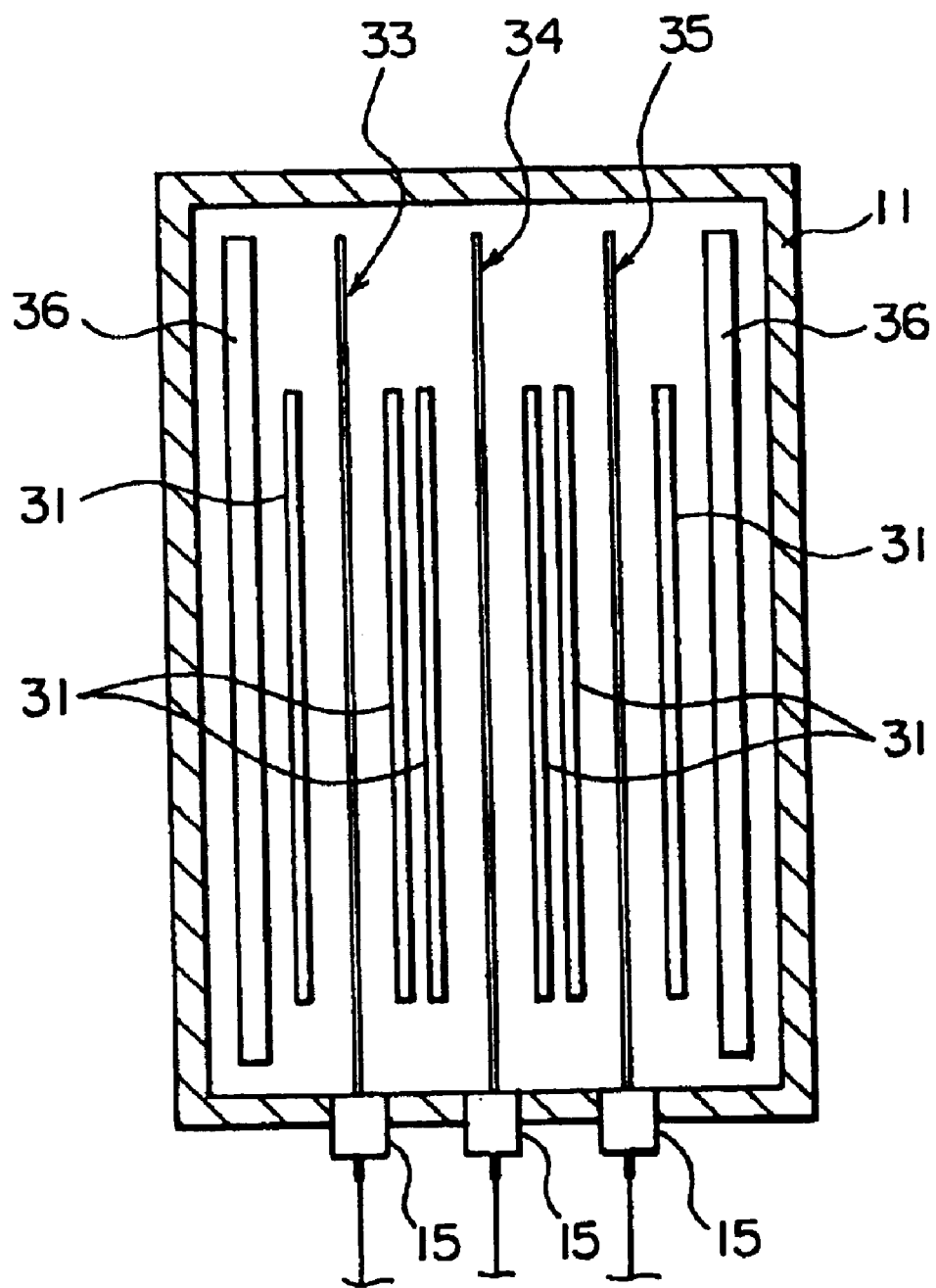
FIG. 5 is a side view of the inside of the above other embodiment.

Next, further, another embodiment of the present invention will be explained with reference to FIG. 4 and FIG. 5. In these figures, elements substantially the same as elements explained with reference to the previous embodiments are assigned the same reference numerals. In this embodiment, three-layered electrode arrays 33, 34 and 35, each comprised of three electrodes 32A, 32B and 32C, are provided in a stratified configuration at predetermined intervals from each other. The individual electrodes 32A to 32C are configured in the same way as the electrode 12 explained in the above-mentioned basic embodiment. In each of the three-layered electrode arrays 33 to 35, the electrodes 32A to 32C are arranged to be contained at equal intervals in the same vertical plane. Further, the three electrode arrays 33 to 35 are arranged so that the planes they form are parallel. Rectangular substrates 31 are arranged at the two sides of each of the electrode arrays 33 to 35 so that their film-deposition surfaces are parallel to the planes formed by the electrode arrays. The rectangular substrates 31 are here glass substrates. Further, as shown in FIG. 5, heaters 36 are arranged at the outside of the outermost rectangular substrates in the film-deposition chamber 11. The heaters 36 hold the rectangular substrates 31 at a predetermined temperature. The film-deposition chamber 11 is grounded.

In the above, each of the electrodes 32A to 32C of the electrode arrays 33 to 35 is supplied with the high frequency power from the single high frequency generator through the connection portion 15. The frequency of the high frequency power supplied to each electrode is, in the same way as explained in the above embodiments, determined considering the plasma parameters around the electrodes. As explained above, the controlled standing waves are produced at each of the electrodes 32A to 32C of the electrode arrays 33 to 35. Uniform plasma is produced at the two sides of each of the electrodes 32A to 32C of the electrode arrays 33 to 35 when the film-deposition chamber 11 is held in the required vacuum state and source gas etc. is introduced. A film is deposited on the film-deposition surfaces of the six rectangular substrates 31 based on the plasma CVD action using the high frequency power (for example, RF). Further, in the configuration of this embodiment, since the electrodes are inductive coupling types, no backing plates are required for holding the rectangular substrates 31 at the ground potential. The same is true of the case of the embodiment of the configuration shown in FIG. 3. In FIG. 4 and FIG. 5, only the substrates 31 were shown, but in practice the substrates 31 are held by support frames. The support frames have window-frame shaped structures.

Figure 6:
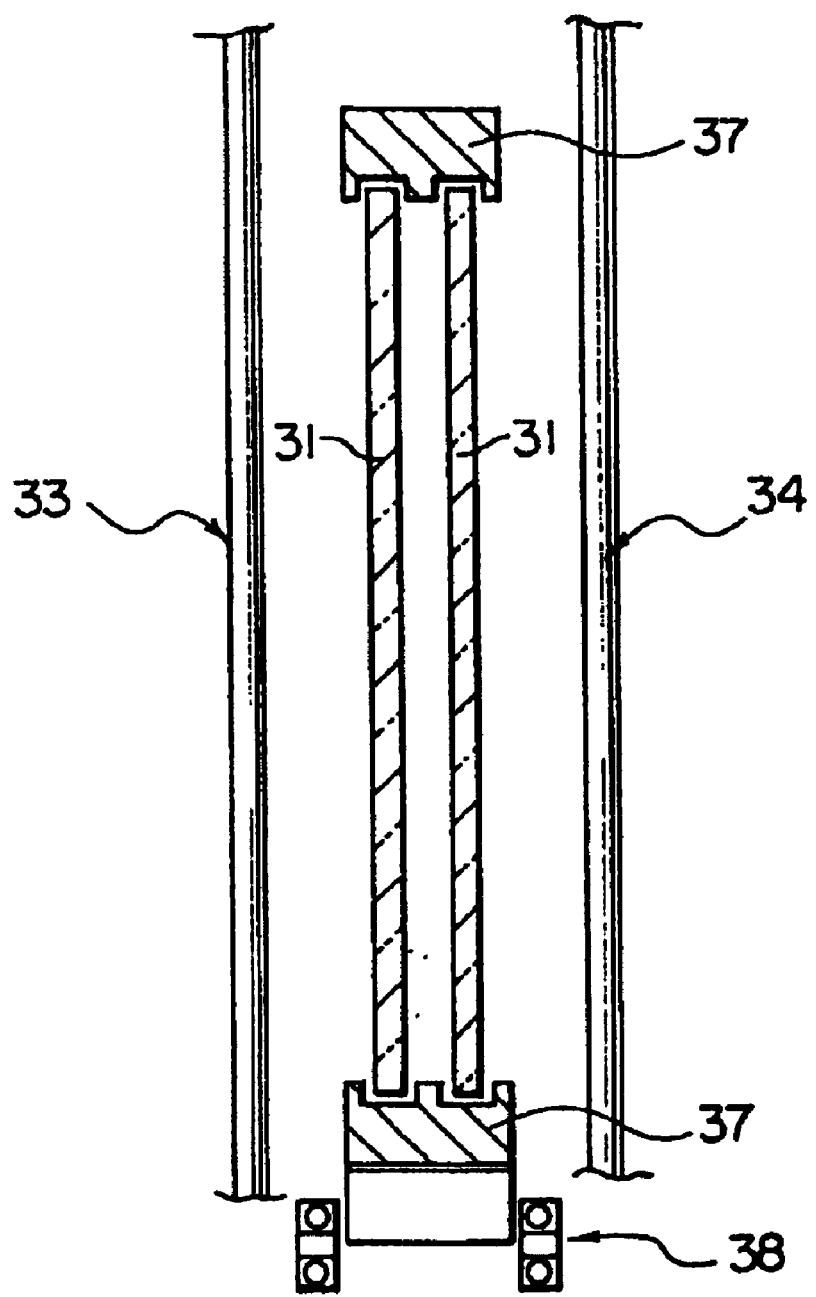
FIG. 6 is a view of an example of the mechanism for conveying a substrate.

FIG. 6 shows a window-frame shaped support frame 37 that sets and supports two substrates 31. A substrate conveying mechanism 38 is provided at the bottom of the support frame 37 and is designed to move the substrates 31 on a guide path. The substrates 31 are conveyed in a direction vertical to the paper surface in FIG. 5 or FIG. 6.

Since the U-shaped electrode is shaped with the feeding end and ground end positioned in the same plane and a plurality of U-shaped electrodes can be arranged so as to be in the same plane as well, a multi-region (or zone) deposition device can be easily realized by utilizing a layered or stratified structure of electrodes arranged at predetermined intervals as shown in FIG. 5. By enabling the multi-region film deposition in this way, films can be formed on a plurality of substrates simultaneously and the throughput of film deposition can be improved. If utilizing the layered structure, further, the ratio of the surface area of the film-deposition surfaces of the rectangular substrates to the volume inside the film-deposition chamber becomes larger, so escape of heat can be suppressed and the power consumption can be suppressed.

Further, according to the above embodiment, since the backing plates of the substrates on which films are to be deposited can be omitted, the cost of the power used for raising the temperature of the backing plates, the cost of the cooling water required for cooling the backing plates, the running costs required for handling the backing plates, the hardware costs due to the load on the conveyance mechanism, and other costs conventionally required can be eliminated. Further, the conventional system provided with backing plates suffered from the problem of lack of uniformity of film thickness or poor film characteristics due to the uneven degree of contact between the backing plates and substrates, but this problem is eliminated.

Figure 7:
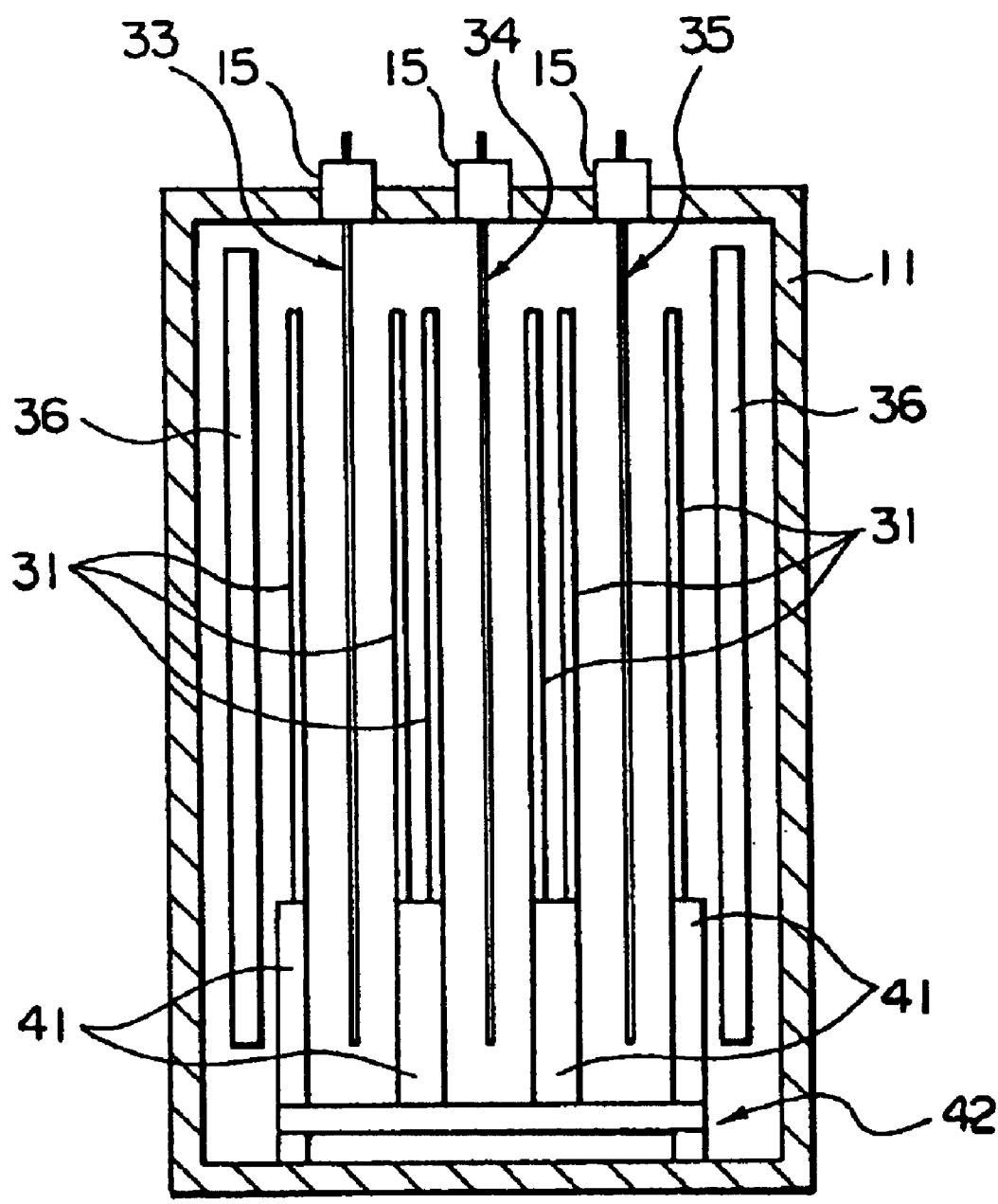
FIG. 7 is a side view of the internal structure of another embodiment of the present invention.

FIG. 7 shows another embodiment of the present invention. In this embodiment, a structure is shown where the U-shaped electrodes of the present invention are provided in the plasma CVD apparatus of the type using substrate carriers for conveyance. The part of the structure relating to the U-shaped electrodes is substantially the same as the structure shown in FIG. 5. Therefore, in FIG. 7, elements substantially the same as the elements shown in FIG. 5 are assigned the same reference numerals. In this embodiment, a substrate conveyance mechanism 42 provided with a substrate support mechanism 41 is provided at the bottom of the film-deposition chamber 11. Therefore, electrode arrays 33 to 35 having the above three-layered structure are arranged attached to the top wall of the film-deposition chamber 11 and hanging down vertically in the film-deposition chamber 11. The rest of the structure is the same as that explained in FIG. 5. The plurality of substrates 31 supported by the substrate support mechanism 41 are conveyed in a direction vertical to the paper surface in FIG. 7 by the substrate conveyance mechanism 42 after the films are finished being formed on them.

In this embodiment as well, it is possible to form a film simultaneously on a plurality of substrates by multi-region deposition and there is no need to provide the backing plates for the substrates on which the films are to be formed, so the effects explained with respect to the above embodiments are also exhibited.

In the above-mentioned embodiments, the bent portions and ends of the electrodes may be provided with covers formed by a dielectric (insulator) to cover them. The covers function as electromagnetic shields blocking the electromagnetic field from the electrode. The covers may also be given the function of elements for adjusting the impedance of the electrode. The covers may for example be given a coaxial cable structure.

In the above-mentioned embodiments, the total length of the U-shaped electrode was set to be equal to the excitation wavelength ($\lambda$), but a similar action can be obtained by an electrode having a general bent back shape where the total length of the electrode is made natural number (a whole) times of a half of the excitation wavelength of the high frequency power supplied if in this case supplying a high frequency power from the end of the electrode and making the node of the standing wave produced at the electrode match with the bent back point of the electrode.

While the invention has been described with reference to specific embodiment chosen for purpose of illustration, it should be apparent that numerous modifications could be made thereto by those skilled in the art without departing from the basic concept and scope of the invention.

INDUSTRIAL APPLICABILITY

As mentioned above, the internal electrode type plasma processing apparatus and method according to the present invention is suited to deposit the film onto the large area substrate, and is useful of making the solar cells by depositing the amorphous silicon thin film on the large substrates, for example.

What is claimed is:

1. In a plasma processing apparatus provided with an inductive coupled electrode for generating plasma in a vacuum processing chamber, the plasma processing apparatus wherein:
    said electrode is formed so that total length thereof is substantially equal to a wavelength of a supplied high frequency power, and is formed so that;
    one end of said electrode is grounded and another end thereof is connected to a high frequency power source for supplying said high frequency power, and a standing wave of one wavelength is produced along said electrode when said high frequency power source supplies said high frequency power to said electrode; and
    a node of said standing wave produced along said electrode is formed at a central portion of said electrode, and an antinode of said standing wave is formed on both portions respectively corresponding to a half portion of said electrode, which exist at both sides of said center point, wherein
    said electrode is formed to be U-shaped by having a bent-back portion at said central portion,
    each of the half portions of said electrode corresponds to a straight portion,
    both of the half portions are arranged in parallel, and a length of the half portion of said electrode is substantially equal to a half of the wavelength of said high frequency power, and
    the length of the half portion of said electrode is about one order of magnitude longer than a width between the half portions.

2. A plasma processing apparatus as set forth in claim 1, wherein a plurality of said electrodes are arranged to make a stratified structure comprising a plurality of layers within said vacuum processing chamber, a plurality of film depositing regions are produced using a space between said electrodes included in said plurality of layers, and film deposition on a substrate is performed in each of said plurality of film depositing regions.

3. In a plasma processing apparatus provided with an inductive coupled electrode for generating plasma in a vacuum processing chamber, the plasma processing apparatus wherein:
    said electrode is formed so that total length is determined to natural number times of a half of a wavelength of a supplied high frequency power, and is formed so that;
    one end of said electrode is grounded and another end thereof is connected to a high frequency power source for supplying said high frequency power, and standing waves are produced along said electrode when said high frequency power source supplies said high frequency to said electrode; and a node of said standing waves produced along said electrode is formed at a central portion of said electrode, and at least one antinode of said standing waves is formed on both portions respectively corresponding to a half portion of said electrode, which existing at both sides of said center point, wherein
   said electrode is formed to be U-shaped by having a bent-back portion at said central portion,
   each of the half portions of said electrode is a straight portion, both of the half portions are arranged in parallel,
   said node of said standing wave is consistent with a bending back point, and
   the lenth of the half portion of said electrode is about one order of magnitude longer than a width between the half portions.

4. A plasma processing apparatus as set forth in claim 3, wherein a plurality of said electrodes are arranged to make a stratified structure comprising a plurality of layers within said vacuum processing chamber, a plurality of film depositing regions are produced using a space between said electrodes included in said plurality of layers, and film deposition on a substrate is performed in each of said plurality of film depositing regions.

5. In a plasma processing apparatus provided with an inductive coupled electrode for generating plasma in a vacuum processing chamber, the plasma processing apparatus, wherein:
   total length of said electrode is substantially equal to a wavelength of a supplied high frequency power;
   one end of said electrode is grounded and another end is connected to a high frequency power source;
   said electrode is formed to be U-shaped so that a central portion of the total length thereof is a bent-back portion, with about half-portions on either side of said bent-back portion;
   each of the about half-portions of said electrode is a straight portion;
   the length of each straight portion is substantially equal to a half of the wavelength of the high frequency power supplied to said electrode;
   the straight portions are arranged in parallel; and
   the length of the about half-portions of said electrode is about one order of magnitude longer than the bent-back portion.

6. A plasma processing apparatus according to claim 5, wherein the length of said electrode is a natural number times a half of the wavelength of the supplied frequency power.

* * * * *